United States Patent [19]

Kim et al.

[11] Patent Number: 5,166,866

[45] Date of Patent: Nov. 24, 1992

[54] SEMICONDUCTOR PACKAGE

[75] Inventors: Young S. Kim, Seoul; Jae M. Ahn, Suweon, both of Rep. of Korea

[73] Assignee: Samsung Electronics Co., Ltd., Suweon, Rep. of Korea

[21] Appl. No.: 706,900

[22] Filed: May 29, 1991

[30] Foreign Application Priority Data

Apr. 3, 1991 [KR] Rep. of Korea .................. 91-5360

[51] Int. Cl.$^5$ .............................................. H05K 7/10
[52] U.S. Cl. .................................... 361/403; 174/253;
174/254; 174/260; 174/261; 361/392; 361/398;
361/404; 361/405; 257/522
[58] Field of Search ............ 361/421, 400, 398, 401,
361/403, 404, 405, 406, 408, 409; 174/253, 254,
255, 52.4; 357/68, 69, 70, 74, 80; 439/68, 70, 71,
77, 78

[56] References Cited

U.S. PATENT DOCUMENTS

| | | | |
|---|---|---|---|
| 3,113,248 | 12/1963 | Friedman | 439/77 |
| 3,967,162 | 6/1976 | Ceresa et al. | 174/254 |
| 4,774,635 | 9/1988 | Greenberg et al. | 361/421 |
| 4,833,568 | 5/1989 | Berhold | 361/398 |
| 4,980,082 | 12/1990 | Champagne et al. | 361/401 |
| 5,046,954 | 9/1991 | Schmedding | 439/70 |

FOREIGN PATENT DOCUMENTS

| | | | |
|---|---|---|---|
| 0007598 | 1/1990 | Japan | 439/68 |
| 0125492 | 5/1990 | Japan | 439/78 |
| 2208570 | 4/1989 | United Kingdom | 439/68 |

OTHER PUBLICATIONS

Electronics (Technical Article) "Film-Carrier Technique Automates the Packaging of IC Chips" by Stephen Grossman, May 16, 1974.

*Primary Examiner*—Leo P. Picard
*Assistant Examiner*—D. Sparks
*Attorney, Agent, or Firm*—Ladas & Parry

[57] ABSTRACT

The present invention relates to a semiconductor package which is suitable for attachment and wire-bonding of a large chip so that the high-performance and high-density tendency of semiconductor devices can be accomplished. According to the present invention, by connecting the electrodes of a chip to leads with electrical connection leads, even a large chip can be loaded without a pad. Also, since the bonding parts and lead-connection parts of the connection leads can be formed arbitrarily at any portion close to the electrodes of the chip, the chip is manufactured simply and the efficiency of the wire-bonding is improved due to the short wire-bonding length so that the reliability of products is efficiently improved.

19 Claims, 2 Drawing Sheets

SEMICONDUCTOR PACKAGE

BACKGROUND OF THE INVENTION

The present invention relates to a semiconductor package which is suitable for loading and wire-bonding of large chips according to high-integration tendency.

Generally, the semiconductor package, which is loaded with the chip, is formed by molding with a compound after attachment of the chip on a pad and wire-bonding the chip with leads arranged at around the pad.

In the package, however, a large space is necessary for the pad on which the chip is attached and a predetermined distance must be kept between the pad and the leads. Thus, the total occupying area of the pad becomes large and the package size becomes large, too.

Also, the increased length of the wire-bonding due to a longer distance between the pad and the leads degrades the efficiency of the wire-bonding and the reliability of products due to the deformation of the wire at the midspan. Moreover, according to the tendency to the multifunction and high-integration density of a chip, the chip size becomes much larger and the number of the leads is also increased in response thereto.

Thus, as shown in FIG. 6, a new package which can be loaded with the chips without the pad has been developed for high-function, high-integration as well as miniaturization. This package is formed by extending a lead 42 to position close to the center of a chip 41 after forming electrodes 41a at the center portion of the chip 41. The chip 41 is supported by such an extended lead 42 which is attached on the chip 41 with an adhesive agent.

If the electrodes 41a are arranged at the center portion of the chip 41, it is possible to support the chip 41 with the lead 42, but if the electrodes 41a are arranged at the outer side of the chip 41, the wire-bonding is impossible.

Also, if the length of the lead 42 is shortened to be suitable for the wire-bonding, the portion to support the chip 41 is reduced, so that the loading of the chip 41 becomes impossible.

SUMMARY OF THE INVENTION

The present invention has been made in consideration of this and has it for an object to provide a semiconductor package which has an advantage in the wire bonding of high-performance and high-integration chips with a plurality of leads such as 4M DRAM's (Dynamic Random Access Memories) as well as miniaturization of the package.

Another object of the invention is to provide a semiconductor package which can easily load the chip regardless of the positions of the electrodes, for example, either of the center or the outer side of the chip.

According to the invention, there is providing a semiconductor package suitable for high-performance and high-integration semiconductor chip by molding with a compound after attaching the chip directly to the lead and wire-bonding between the lead and the electrode, in which the electrode is connected to the lead by electrical means.

DETAILED DESCRIPTION OF THE INVENTION

The present invention will be now described in more detail with reference to the accompanying drawings.

Figure 1:
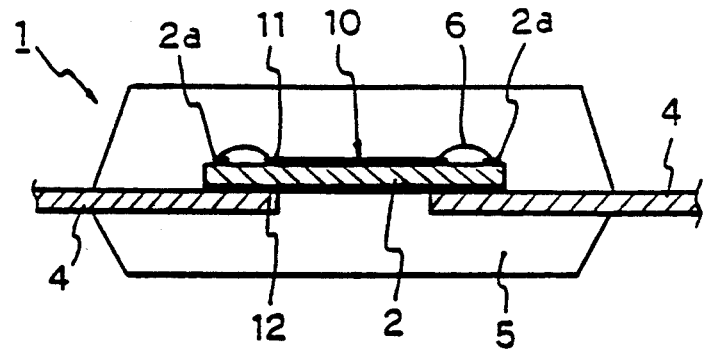
FIG. 1 is a cross-sectional view of a semiconductor package of an embodiment according to the invention.
Figure 2:
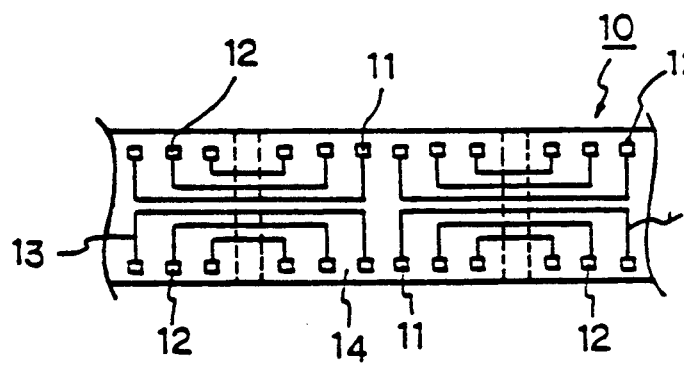
FIG. 2(A) is an unfolded view of a connection body according to the invention.
FIG. 2(B) is a cross-sectional view of a chip on which the connection body is mounted.
Figure 2:
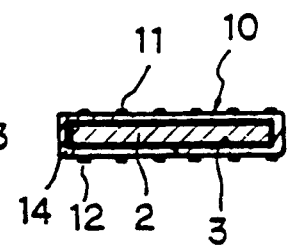
Figure 3:
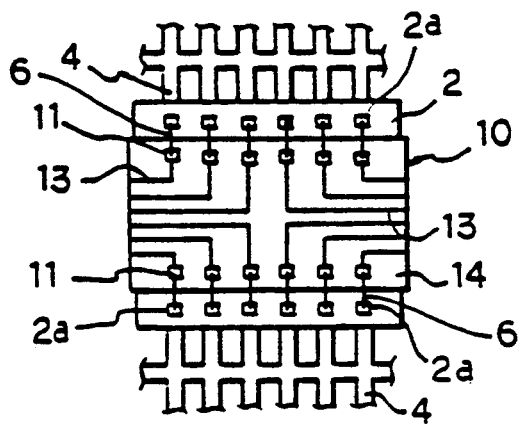
FIGS. 3(A) and 3(B) are views illustrating the bonding of the chip by the connection body.
Figure 3:
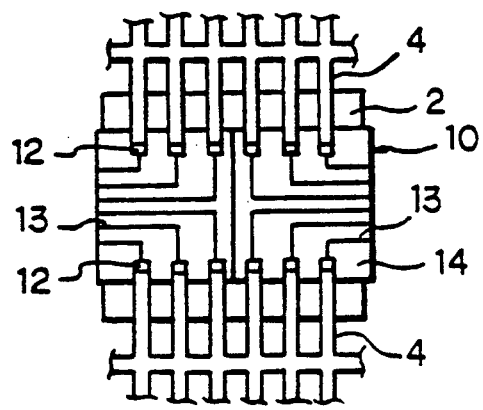
Figure 4:
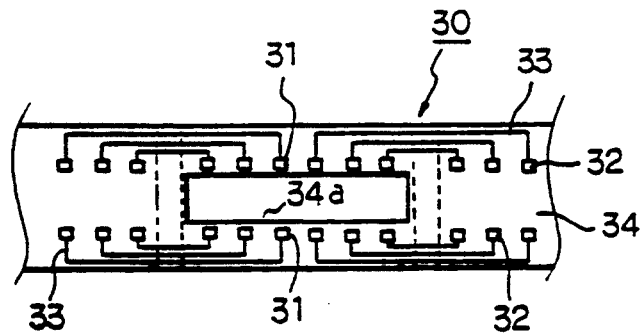
FIG. 4 is a plane view illustrating a connection body of another embodiment according to the invention.
Figure 5:
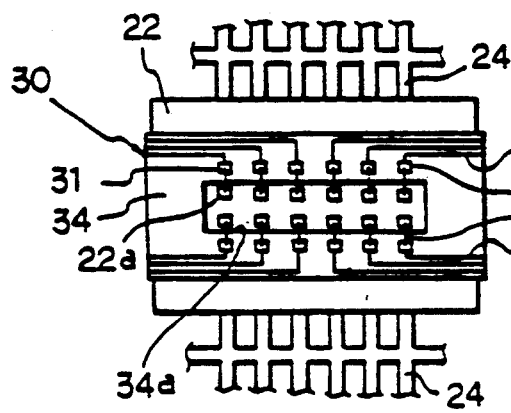
FIGS. 5(A) and 5(B) are views illustrating the bonding of a chip by the connection body as shown in FIG. 4 and, FIG. 6 is view illustrating the bonding of a conventional chip.
Figure 5:
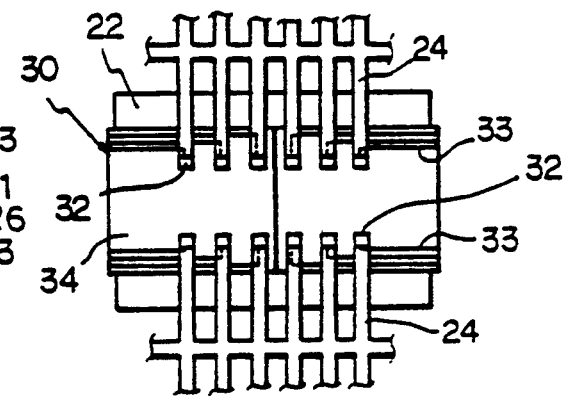
Figure 6:
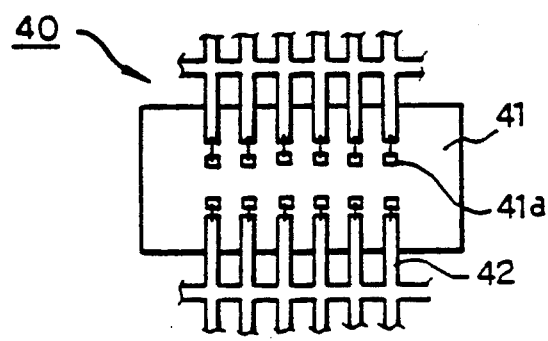

FIG. 1 ~ FIGS. 5(A) and 5(B) show the semiconductor package according to the present invention.

A chip 2 is surrounded by an electrical connection body 10 except for its electrodes 2a to be exposed. In the connection body 10, bonding parts 11 are connected to each lead-connection parts 12 through fine metal lines 13 as shown in FIG. 2(A), and wire-bonded with the electrodes 2a of the chip 2.

The bonding and lead-connection parts 11 and 12 are symmetrically formed each other at both sides of an insulating tape 14. Subsequently, the connection body 10 is adhered to the chip 2 which is attached on a lead 4 as shown in FIG. 2(B).

At this time, the bonding parts 11 are located at the top of the chip 2 and the lead-connection parts 12 are located at the bottom of the chip 2.

Subsequently, the electrodes 2a of the chip 2 are wire-bonded with the bonding parts 11 of the connection body 10 by wire-bonding line 6, and the lead-connection parts 12 are connected to the leads 4 by bump or metal-paste of high conductivity, as shown in FIGS. 3(A) and 3(B).

Finally, a semiconductor package 1 is completed by molding with the compound. If the electrodes 2a are formed at the outer side of the chip 2 as shown in FIGS. 3(A) and (B), the bonding parts 11 and the lead-connection parts 12 are also arranged at the outer side of the insulating tape 14 close to the electrodes 2a, and connected with the fine metal lines 13 to the inside of the insulating tape 14. However, if the electrodes 22a are formed at the center portion of the chip 22, the bonding parts 31 and the lead-connection parts 32 are arranged at the center portion of the insulating tape 34, and the fine metal lines 33 are located at the outer side of the insulating tape 34.

In this case, an opening part 34a is formed in the insulating tape 34 to expose the electrodes 22a of the chip 22. Such electrodes 22a are connected to the bonding parts 31 by a wire-bonding line 26 and the lead-connection parts 32 are connected to the leads 24 by the adhesive agent.

As described above, the chip 2 is surrounded by the connection body 10 and adhered to the connection body 10 by the adhesive agent. After locating the bonding parts 11 of the connection body 10 by the wire-bonding lines 26 at the front side of the chip 2 and locating the lead-connection parts 12 at the back side of the chip 2, the electrodes 2a of the chip 2 are wire-bonded to the bonding parts 11 of the connection body 10 and the lead-connection parts 12 are linked with the lead 4.

On the other hand, the bonding parts 11 and the lead-connection parts 12 are connected by the fine metal lines 13.

According to the invention, since the chip 2 is attached on the lead 4 without any pad, the area and space in the package are efficiently utilizable and it becomes possible to load a large chip in the package.

Furthermore, although the electrodes 2a, and 22a are formed at any position, for example, either of the center or outside of the chip as shown in FIG. 2~FIGS. 5(A) and 5(B), the wire-bonding parts 11 and 31 can be located at any position, for example, either of the center or outside of the connection bodies 10 and 30 corresponding to those of the electrodes 2a and 22a.

The electrodes 2a and 22a of the chips 2 and 22 are finally connected to the leads 4 and 14 by the fine metal lines 13 and 33 on the symmetrical connection bodies 10 and 30 so that the degree of freedom for the design of chips 2 and 22 is maximized.

In addition, the efficiency of the wire-bonding is improved, since the bonding parts 11 and 31 of the connection bodies 10 and 30 are disposed adjacently to the electrodes 2a and 22a of the chips 2 and 22 and the length of the wire-bonding is shortened.

Even when the electrodes 2a of the chip 2 are formed at the edge as shown in FIGS. 3(A) and 3(B), the chip 2 is supported by the lead 4 with a sufficient contact area. If the lead-connection parts 12 are formed at the center portion of the chip 2, the contact area of the lead 4 is more increased.

As mentioned hereinabove, the semiconductor package according to the present invention can load the large chip without the pad since the chip is directly attached to the leads and the electrodes are indirectly connected to the leads to provide the power.

In addition, the wire-bonding with the wire-bonding parts can be freely adhered at the neighboring position of the electrodes of the chip so that the design of the chip is simple and the length of the wire-bonding is shortened so that the efficiency of the wire-bonding as well as the reliability of the product is efficiently improved.

What is claimed is:

1. A semiconductor package molded in a compound after attaching a chip to leads and wire-bonding said leads with electrodes of said chip, which is characterized in that said leads and said electrodes are connected by an electrical connection body to provide electrical power for the attachment of a high-performance and high-density semiconductor chip, wherein said connection body comprises bonding parts to be wire-bonded to electrodes formed at the outside of said chip and lead-connection parts to be connected to said leads, each of said bonding parts and said lead-connection parts being formed at outside of an insulating tape with left-and-right symmetrical structure so as to be connected with corresponding lead-connection parts and bonding parts by fine metal lines.

2. In a semiconductor package having a chip having opposing first and second surfaces, an electrically insulative compound molded about the chip, and electrically conductive leads projecting from the compound and connected to electrodes on the first surface of the chip, an improved connection-body assembly for connection of the leads to the electrodes comprising:

an electrically insulative tape having a first adhesive surface and an opposite second surface, the tape extending about the chip with one portion of the first surface of the tape adhered to one portion of the first surface of the chip that does not have the electrodes and another portion of the first surface of the tape adhered to the second surface of the chip;

electrically conductive bonding parts on one portion of the second surface of the tape that is opposite the one portion of the first surface of the tape;

wire bondings between the electrodes on the chip and the bonding parts on the tape;

electrically conductive lead-conductive parts on another portion of the second surface of the tape that is opposite the other portion of the first surface of the tape, the lead-connection parts being connected to the leads that project from the compound; and metal lines on the second surface of the tape connecting the bonding and lead-connection parts.

3. The semiconductor package of claim 2, wherein the electrodes are arranged spaced from each other in rows along opposite edges of the chip, and the one portion of the first surface of the chip is a central portion of the first surface of the chip between the rows of the electrodes.

4. The semiconductor package of claim 3, wherein the lead-connection parts are arranged on the other portion of the second surface of the tape in correspondence with an arrangement of the bonding parts on the one portion of the second surface of the tape.

5. The semiconductor package of claim 4, wherein the arrangement of the bonding parts corresponds to the arrangement of the electrodes.

6. The semiconductor package of claim 5, wherein the wire bondings respectively connect the electrodes to the bonding parts, the metal lines respectively connect the bonding parts to the lead-connection parts, and the lead-connection parts are respectively connected to the leads.

7. The semiconductor package of claim 4, wherein the wire bondings respectively connect the electrodes to the bonding parts, the metal lines respectively connect the bonding parts to the lead-connection parts, and the lead-connection parts are respectively connected to the leads.

8. The semiconductor package of claim 3, wherein the arrangement of the bonding parts corresponds to the arrangement of the electrodes.

9. The semiconductor package of claim 3, wherein the wire bondings respectively connect the electrodes to the bonding parts, the metal lines respectively connect the bonding parts to the lead-connection parts, and the lead-connection parts are respectively connected to the leads.

10. The semiconductor package of claim 2, wherein the electrodes are arranged spaced from each other in rows along a central portion of the first surface of the chip, and the tape further comprises an aperture through a central portion of the one portions of the first and second surfaces, the aperture being at the central portion of the first surface of the chip.

11. The semiconductor package of claim 10, wherein the lead-connection parts are arranged on the other portion of the second surface of the tape in correspondence with an arrangement of the bonding parts on the one portion of the second surface of the tape.

12. The semiconductor package of claim 11, wherein the arrangement of the bonding parts corresponds to the arrangement of the electrodes.

13. The semiconductor package of claim 12, wherein the wire bondings respectively connect the electrodes to the bonding parts, the metal lines respectively connect the bonding parts to the lead-connection parts, and the lead-connection parts are respectively connected to the leads.

14. The semiconductor package of claim 11, wherein the wire bondings respectively connect the electrodes to the bonding parts, the metal lines respectively connect the bonding parts to the lead-connection parts, and the lead-connection parts are respectively connected to the leads.

15. The semiconductor package of claim 10, wherein the arrangement of the bonding parts corresponds to the arrangement of the electrodes.

16. The semiconductor package of claim 10, wherein the wire bondings respectively connect the electrodes to the bonding parts, the metal lines respectively connect the bonding parts to the lead-connection parts, and the lead-connection parts are respectively connected to the leads.

17. The semiconductor package of claim 2, wherein the lead-connection parts are arranged on the other portion of the second surface of the tape in correspondence with an arrangement of the bonding parts on the one portion of the second surface of the tape.

18. The semiconductor package of claim 17, wherein the wire bondings respectively connect the electrodes to the bonding parts, the metal lines respectively connect the bonding parts to the lead-connection parts, and the lead-connection parts are respectively connected to the leads.

19. The semiconductor package of claim 2, wherein the wire bondings respectively connect the electrodes to the bonding parts, the metal lines respectively connect the bonding parts to the lead-connection parts, and the lead-connection parts are respectively connected to the leads.

* * * * *